United States Patent [19]

Choi

[11] Patent Number: 5,060,036

[45] Date of Patent: Oct. 22, 1991

[54] THIN FILM TRANSISTOR OF ACTIVE MATRIX LIQUID CRYSTAL DISPLAY

[75] Inventor: Kwangsu Choi, Suwon, Rep. of Korea

[73] Assignee: Samsung Electron Devices Co., Ltd., Rep. of Korea

[21] Appl. No.: 458,324

[22] Filed: Dec. 28, 1989

[30] Foreign Application Priority Data

Dec. 31, 1988 [KR] Rep. of Korea .................... 88-18214
Dec. 31, 1988 [KR] Rep. of Korea .................... 88-18215

[51] Int. Cl.$^5$ ........................................... H01L 27/01
[52] U.S. Cl. ...................................... 357/23.7; 357/4; 357/49; 359/59
[58] Field of Search .................. 357/4, 23.7, 49; 350/332, 333

[56] References Cited

U.S. PATENT DOCUMENTS 4,876,582 10/1989 Janning .......................... 357/23.7 X
4,979,006 12/1990 Tanaka et al. ........................ 357/4

FOREIGN PATENT DOCUMENTS 0114263 5/1988 Japan ..................................... 357/4

OTHER PUBLICATIONS

"Charge Trapping Instabilities in Amorphous Silicon-Silicon Nitride Thin Film Transistors" M. J. Powell, pp. 597-599, *Appl. Phys. Lett.* 43(8), Sep. 15, 1983.

*Primary Examiner*—William Mintel
*Assistant Examiner*—Roy Potter

[57] ABSTRACT

A thin film transistor of active matrix LCD comprising amorphous silicon layer formed on gate insulating layer and doped with phosphorous or boron, and insulating layer having two laminated structure and SiN layer formed between said two amorphous silicon layers so as to enhance characteristics of the TFT and protect short circuit in the cross points between the gate and source electrodes.

4 Claims, 1 Drawing Sheet

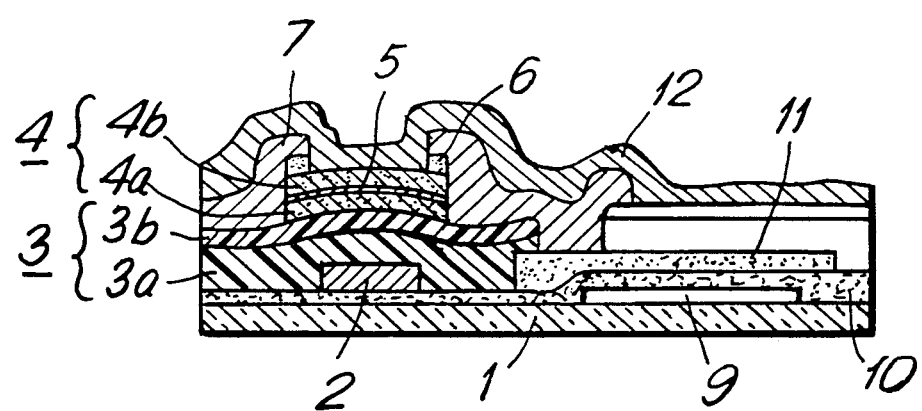

THIN FILM TRANSISTOR OF ACTIVE MATRIX LIQUID CRYSTAL DISPLAY

BACKGROUND OF THE INVENTION

The present invention relates to a thin film transistor of active matrix liquid crystal display and, more particularly to a thin film transistor used in active matrix liquid crystal display, which comprises a two laminated structure of insulating layer coated on gate electrode, and amorphous silicon (hereinafter referred to as "a-Si") layers doped with phosphorus or boron at a predetermined rate and SiN layer of desirable thickness formed between said amorphous silicon layers having upper and lower layers.

Generally, an active matrix liquid crystal display (hereinafter referred to as "active matrix LCD") having a thin film transistor has been used for a display device of a television set, since it may be embodied due to its low consumption driving, thin film, light weight and high quality imaging properties.

However, when such a thin film of active matrix LCD is manufactured, there is a general problem that the production yield is low due to the need to carry out several photography etching processes.

The laminated structure of a gate insulating layer of a thin film transistor (hereinafter referred to as "TFT"), which is manufactured by the above mentioned process, not only extremely effects its characteristics, but electrically isolates the cross points between the gate electrode and the source electrode.

However, a problem with the said TFT is the short circuiting in the cross point between the gate electrode and the source electrode due to the weakening of the gate electrode and a-Si layer.

In addition, the conventional TFT is fabricated with only one $SiO_2$ layer as the gate insulating layer. Therefore, when a threshold voltage in accordance with the operation of the TFT is in excess of 5 volts, the electron mobility is less than the range of 0.1 to 0.3 $cm^2$/v.sec.

The TFT under said operating condition may be able to drive a liquid crystal panel, but an LCD embodying the said TFT may not be able to enhance the manufacturing yield and high quality of the LCD.

SUMMARY OF THE INVENTION

In order to solve the above mentioned problems in accordance with the present invention, it is an object of the present invention to provide a thin film transistor of liquid crystal display, which comprises an amorphous silicon (a-Si) layer fomed on a gate insulating layer and doped with phosphorus (P) or boron (B) so as to enhance characteristics of a thin film transistor.

It is another object of the present invention to provide a thin film transistor of liquid crystal display, which comprises an insulating layer having two laminated structures and a SiN layer formed between two amorphous silicon layers to protect against short circuiting in the cross points between the gate and source electrodes.

BRIEF DESCRIPTION OF THE DRAWING

The above object and other advantages of the present invention will become more apparent by describing in detail the preferred embodiment of the present invention with reference to the accompanying drawing in which:

The accompanying drawing is a transverse cross sectional view of a thin film transistor of active matrix liquid crystal display according to the present invention.

DETAILED DESCRIPTION OF THE INVENTION

Referring to the accompanying drawing, ITO (indium tin oxide) is coated on a glass substrate 1 and a capacitor 9 is formed on the glass substrate 1 in a predetermined pattern, and sequentially $SiO_2$ layer 10 is formed of 3KÅ thickness on the upper surface of the capacitor 9, including the overall surface of the substrate 1.

The surface of the $SiO_2$ is coated with ITO and Cr in turn to form the pattern of gate electrode 2 and ITO pixel 11, and then on the gate electrode 2 are formed two laminated structures of $SiO_2$ insulating layer 3 in order to isolate the gate electrode and the source electrode being manufactured.

In the structure of a $SiO_2$ insulating layer, the conventional structure is single structure of an insulating layer of 3KÅ in thickness, and therefore short circuiting occurs in the cross points between the gate and source electrodes due to pinholes in the insulating layer.

Accordingly, the $SiO_2$ insulating layer 3 according to the present invention is formed so that a first $SiO_2$ insulating layer 3a and then a second $SiO_2$ insulating layer 3b, are formed on the gate electrode to prevent pinholes in said insulating layer and short circuiting between the electrodes.

After manufacturing the said $SiO_2$ insulating layer 3, two laminated a-Si layers 4 are formed on the insulating layer 3 with a SiN layer 5 formed of 1-100 Å thickness between the two laminated a-Si layers 4a and 4b.

In addition, on the a-Si layer 4b is seqentially formed n+ a-Si layer 6, as the ohmic layer, and aluminum metal electrodes 7 and 8. In the accompanying drawing, reference numerals 7 and 8 the source electrode and the drain electrode respectively.

To form several patterns of the said TFT, semiconductor layers thereof are manufactured by using the dry etching process as generally known, in which the etching gas utilized in said process etches only the silicon layer, and so the TFT according to the present invention is able to prevent short circuiting between the gate and source electrodes.

In addition the a-Si layer 4 is doped with phosphorus (P) or boron (B) respectively, of 0.1 to 1 PPM, and so that the TFT embodying the a-Si layer 4 has a threshold voltage lower than that of the conventional art and is relatively high in electric field mobility.

The TFT described above is operated under the condition that the threshold voltage is about 1-2 volts lower than that of the conventional TFT and the electric field mobility is relatively higher by more than 0.5 $Cm^2$/V.sec.

As described above, the thin film transistor of LCD according to the present invention is formed so that the SiN layer of 1-100 Å thickness is formed between two laminated structure of amorphous silicon layers, so that the leakage current and short circuiting in the cross point between the gate and source electrodes may be prevented, thereby enhancing the producing yield of the TFT and providing high quality characteristics of the TFT in connection with the electric field mobility due to the low threshold voltage of the present invention rather than the conventional art.

What is claimed is:

1. A thin film transistor used in active matrix liquid crystal display comprising:

two laminated $SiO_2$ insulating layers, a second layer of $SiO_2$ being disposed on top of a first layer of $SiO_2$, electrically isolating a gate electrode from a source electrode and preventing short circuiting therebetween and said second layer of $SiO_2$ providing insulation from pinholes in said first layer of $SiO_2$;

a semiconductor layer formed of two laminated amorphous silicon layers formed on the $SiO_2$ insulating layer and a layer of SiN of predetermined thickness formed between said two amorphous silicon layers to protect against leakage current and short circuiting in cross points between the gate electrode and the source electrode.

2. A thin film transistor of active matrix liquid crystal display as claimed in claim 1 in which said SiN layer is of less than 100 Å thickness.

3. A thin film transistor of active matrix liquid crystal display as claimed in claim 1 in which said amorphous silicon layers are doped with at least one of a group consisting of phosphorus and boron at the predetermined rate.

4. A thin film transistor of active matrix liquid crystal display as claimed in claim 3 in which said at least one of a group consisting of phosphorus and boron is doped in said amorphous silicon layers in an amount ranging from 0.1 to 1 PPM.

* * * * *